United States Patent [19]

Sano et al.

[11] Patent Number: 5,042,485
[45] Date of Patent: Aug. 27, 1991

[54] CINE MR IMAGING METHOD AND APPARATUS

[75] Inventors: Koichi Sano, Sagamihara; Tetsuo Yokohama, Tokyo; Hideaki Koizumi, Katsuta, all of Japan

[73] Assignee: Hitachi, Ltd., Tokyo, Japan

[21] Appl. No.: 358,925

[22] Filed: May 31, 1989

[30] Foreign Application Priority Data

Jun. 7, 1988 [JP] Japan ................................ 63-140210

[51] Int. Cl.$^5$ ............................................. A61B 5/055
[52] U.S. Cl. ................................ 128/653 A; 128/671; 128/721; 128/653 AF; 324/306; 324/309
[58] Field of Search ............ 128/653 A, 653 AF, 671, 128/721; 324/306, 309

[56]  References Cited

U.S. PATENT DOCUMENTS

| 4,565,968 | 1/1986 | Macovski ............................. 324/306 |
| 4,698,592 | 10/1987 | Feinberg ............................. 324/306 |
| 4,716,367 | 12/1987 | Putz ..................................... 324/306 |
| 4,727,882 | 3/1988 | Schneider et al. ................... 128/653 |
| 4,739,766 | 4/1988 | Riederer ............................... 128/653 |
| 4,782,834 | 11/1988 | Hennig et al. ....................... 324/306 |
| 4,855,910 | 8/1989 | Bohning ............................... 324/309 |

FOREIGN PATENT DOCUMENTS

| 0117725 | 2/1984 | European Pat. Off. . |
| 36282224 | 3/1987 | Fed. Rep. of Germany . |
| 3918625 | 10/1990 | Fed. Rep. of Germany . |
| 2190502 | 11/1987 | United Kingdom . |

OTHER PUBLICATIONS

IEEE, Trans. on Medical Imaging, MI-5, No. 3 (1986), pp. 140-151.

Primary Examiner—Lee S. Cohen
Assistant Examiner—John D. Zele
Attorney, Agent, or Firm—Pennie & Edmonds

[57]  ABSTRACT

In order to image on a time axis a moving object such as a coronary artery which changes in position dynamically along with the heart, the position to which the object has moved is measured and then the position of the object to be excited by a radio frequency field is changed in accordance with the measured position.

7 Claims, 8 Drawing Sheets

| | X | Y | Z |
|---|---|---|---|
| 1 | | | |
| 2 | | | |
| 3 | | | |
| ⋮ | | | |

CINE MR IMAGING METHOD AND APPARATUS

BACKGROUND OF THE INVENTION

This invention relates to a method and an apparatus for imaging a moving object which utilizes the magnetic resonance phenomena (termed "MRI" hereinafter).

The conventional blood vessel imaging techniques are discussed in detail in publication "IEEE, Trans. on Medical Imaging, MI-5", No. 3, (1986), pp. 140–151, for example.

The techniques essentially fall into either the subtraction method or the cancellation method. Both methods use a pulsed magnetic field having a gradient which causes a phase change to occur due to flow in the imaging region. We call this pulsed magnetic field the flow-encode pulse. When the gradient of the flow-encode pulse exists in the flow direction, a phase change dependent on the flow velocity occurs.

The subtraction method implements the subtraction of reproduced images of the flow-sensitive sequence which includes the above-mentioned phase change corresponding to blood flow along the gradient of the flow-encode pulse and the flow-insensitive sequence which has no such phase information. Since the blood flow within a blood vessel forms layers, the imaging based on the phase change information from the flow-sensitive sequence results in the occurrence of phase changes depending on the distance from the center of the blood vessel. Image data cancel each other by being integrated, and therefore no signal is produced from the blood vessel, whereas in the flow-insensitive sequence, the phase is not changed by the movement, and therefore signals are produced from a blood vessel having layers of flow. A static portion produces signals in both sequences. Subtraction of both sequences results in the subsidence of a static portion, and only a blood vessel portion appears as a difference of the two sequence.

The cancellation method reveals blood vessels by a single imaging process. At spin excitation, a radio frequency field equivalent to a 360° pulse is applied and, at the same time, a flow-encode pulse is applied. A static portion restores the original state, producing no signal, whereas a moving portion has its phase changed by the flow-encode pulse, producing a signal. Accordingly, imaging the observation signal reveals only blood vessels.

There is a method of blood flow measurement called "time-of-flight method", although it is not a blood vessel imaging method. A typical practice of the method is that the upstream section of a stream is excited and spins flowing out of it are imaged to produce a picture, as described in publication "Radiology", Vol. 159, pp. 195–199, 1986. The flow velocity can be measured from positions of imaged spins based on the fact that a spin at a high flow velocity is imaged farther from a reference position, and a spin at a low flow velocity is imaged nearer to it.

Among the above-mentioned techniques, the subtraction method and cancellation method make images of all moving parts within the view field, and therefore they intrinsically cannot distinguish the coronary artery running on the exterior wall of the heart from the blood inside the heart which makes it difficult to image the coronary artery.

On the other hand, by application of the time-of-flight method to the imaging of blood vessels, it is possible in principle to image only the coronary artery through the excitation of the upstream section of the coronary artery. For example, U.S. patent application Ser. No. 379,674 discloses an example of blood vessel imaging methods which uses the time-of-flight method. However, because of the movement of the heart to which the coronary artery belongs, it is difficult for the conventional time-of-flight method, in which the position of excitation by a radio-frequency pulse is fixed, to image the coronary artery which changes position continuously.

SUMMARY OF THE INVENTION

The present invention is intended to cope with the foregoing situation, and its prime object is to provide a method and apparatus for recognizing changes on a time axis of a moving object such as the coronary artery which changes its position dynamically in response to heart beats.

The above objective is achieved by a magnetic resonance imaging apparatus comprising means of generating a static magnetic field, a gradient magnetic field and a radio-frequency excitation field, means of detecting a nuclear magnetic resonance signal from an object under test, and means for computations including image reproduction from the detected signal, and by a moving object imaging method in which the position of the object under test is measured by the detection means and the position of excitation by the radio-frequency field is then varied, by varying that frequency, in accordance with the result of the measured position. The moving object imaging apparatus is further provided with means of detecting the movement of the object under test, means of varying the frequency and thus the position of excitation by the radio-frequency field in accordance with the result of position measurement for the object by the detection means and means of displaying reproduced images continuously.

The present moving body imaging method controls the position of spin excitation based on the above-mentioned position measurement, whereby the portion including the root of coronary artery, for example, is excited invariably despite the movement of heart. As shown by a model heart in FIG. 4, the coronary branches at the root 305 of the aorta 301, which comes out of the heart 302, into a left coronary artery 303 and a right coronary artery 304. Accordingly, by observation of the signal following the blood spin excitation for a region which includes the root of aorta 305 and does not include the left coronary artery 303 or right coronary artery 304 to be imaged, only the intended coronary artery is imaged.

DESCRIPTION OF THE PREFERRED EMBODIMENTS

Figure 2:
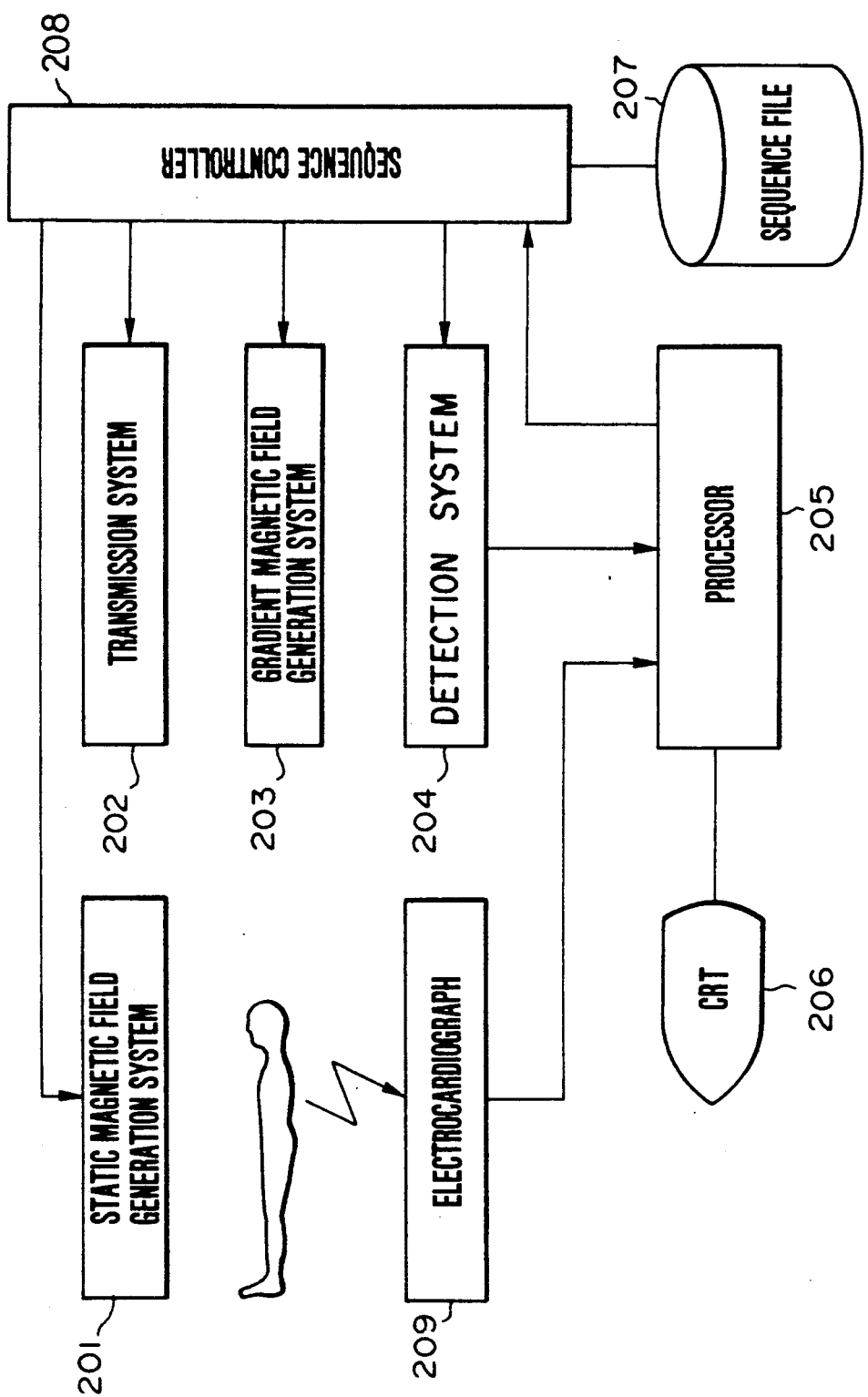
FIG. 2 is a block diagram of the apparatus which embodies the present invention.

FIG. 2 is a block diagram showing the arrangement of the MRI apparatus based on this invention. In the figure, indicated by 201 is a static magnetic field generation system for generating a uniform static magnetic field, 202 is a transmission system which generates a radio-frequency magnetic field for spin excitation, 203 is a gradient magnetic field generation system which is capable of varying in linear the magnitude of magnetic field in the x, y and z directions independently, 204 is a detection system which receives an electromagnetic wave generated by an object under test and performs A/D conversion following the detection of it, 205 is a processor which performs various computations for the measured data provided by the detection system necessary for image reproduction, 206 is a CRT unit for displaying the reproduced result, 207 is a pulse sequence file which stores the control sequences of all systems, 208 is a sequence controller which controls the operational timing of each device in accordance with the control sequences stored in the pulse sequence file, and 209 is an electrocardiograph which monitors the state of the heart of the body under test. Based on the result provided by the electrocardiograph 209, the processor 205 issues to the sequence controller 208 the instruction on the frequency of radio-frequency field to be generated by the transmission system 202.

Figure 3:
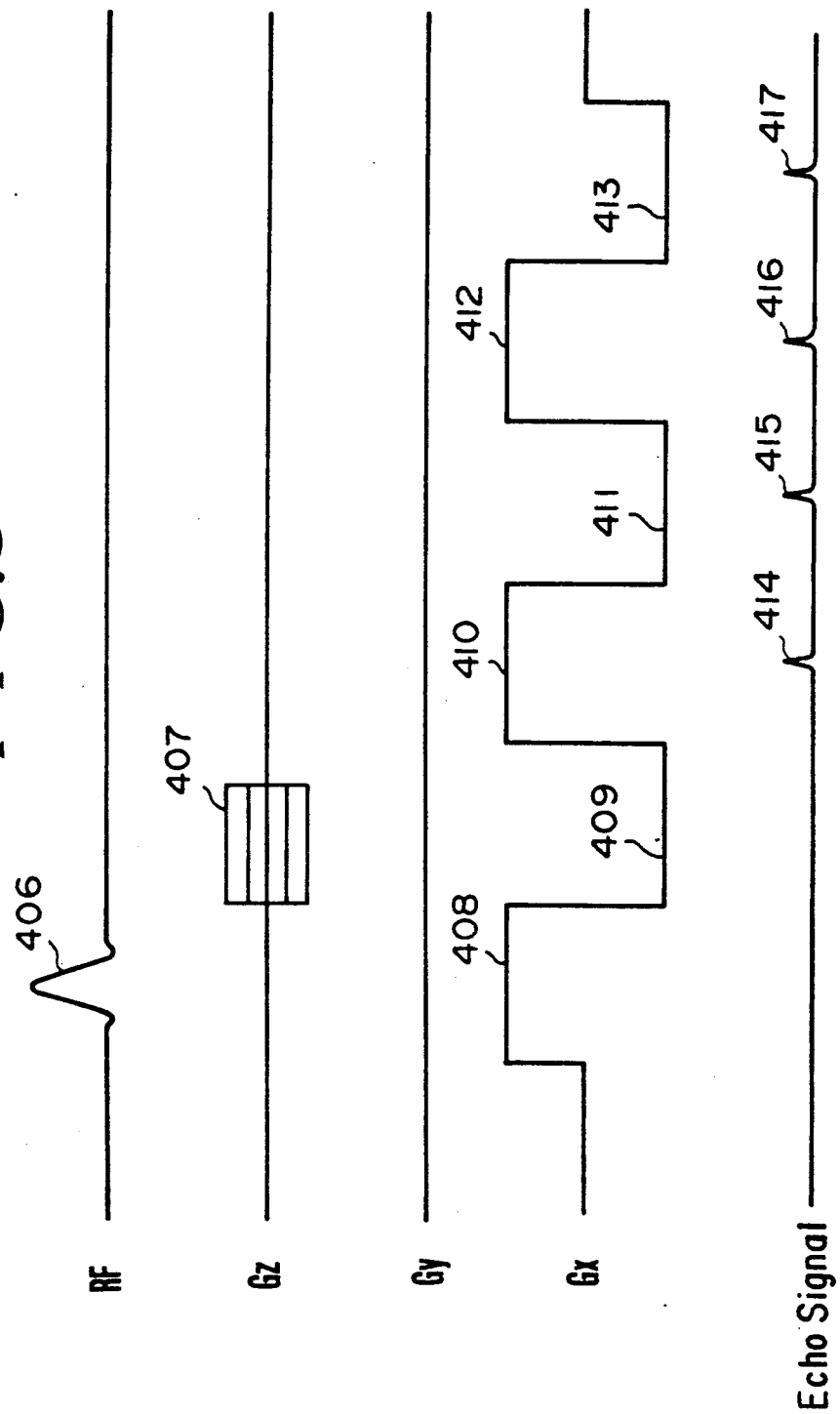
FIG. 3 is a diagram showing, as an example, the pulse sequence based on the embodiment.
Figure 4:
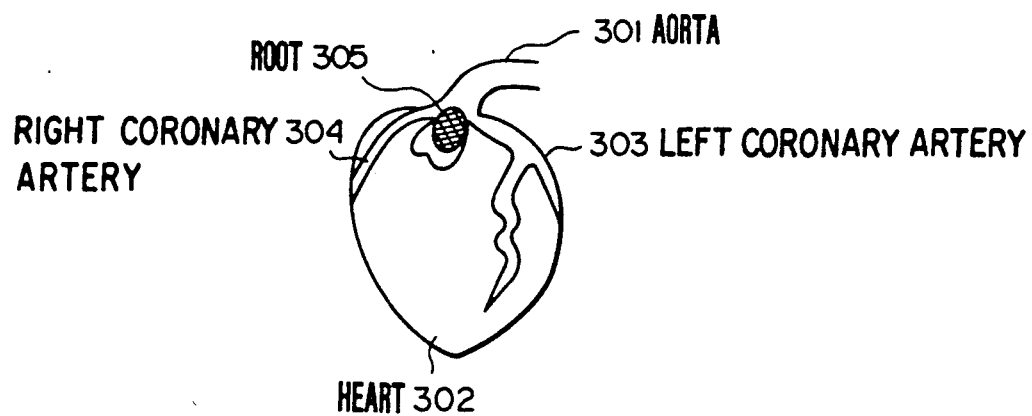
FIG. 4 is a diagram showing a model of the heart.

FIG. 3 shows an example of the pulse sequence employed by the present invention. The sequence, stored in advance in the pulse sequence file 207, provides operational timing information to the sequence controller 208. Because of the correspondence between the frequency of radio-frequency field used for spin excitation and the excitation position, the frequency of radio-frequency field needs to be set at each imaging with reference to the waveform measured by the electrocardiograph 209 and a positional information map which has been measured in advance.

Figure 5:
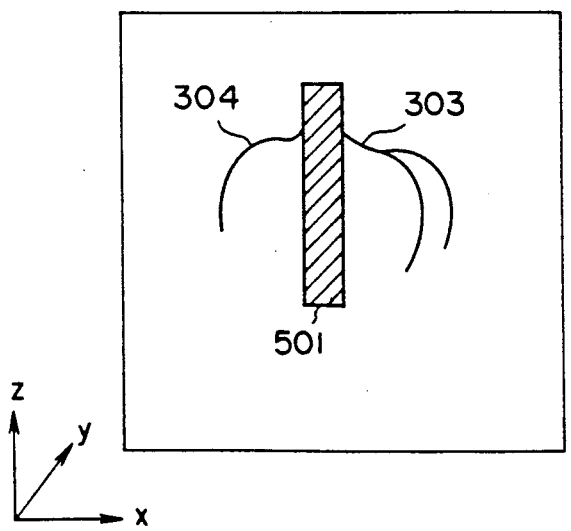
FIG. 5 is a diagram explaining the image produced by the sequence of FIG. 3.

In the sequence shown in FIG. 3, RF is the application timing of the radio-frequency field generated by the transmission system 202, Gz, Gy and Gx are application timings of the gradient magnetic field in the z, y and x directions, respectively, and Signal (measurement signal) is to indicate the timing of measurement of the measurement signal 408. FIG. 5 shows the positional relation of the coordinates of the image.

The following describes the operation of this embodiment with reference to FIGS. 2 through 5. Simultaneously to the application of the radio-frequency field RF 406, the gradient magnetic field in x-direction Gx 408 is applied. Consequently, only a region indicated by 501 in FIG. 5 is excited. This region includes the root of the aorta 305 shown in FIG. 4. Following the application of the Gx 409 for the cancellation of the influence of the Gx 408, measurement signals 414, 415, 416 and 417 are sampled by altering the Gx as indicated by 410, 411, 412 and 413. Although only up to a fourth echo signal is measured in this example, it is possible to observe up to several tens of echos by application of alternate magnetic fields successively.

With the transverse relaxation time being ignored, these signals are identical if the object under test has no movement. However, in the case where the blood flow is the object, detection of electromagnetic waves generated at locations where excited spins exist results in the production of different signals. By using at least one of these signals, for example, by summing two or more of these signals and reconstructing an image from the signals, a blood vessel system is visualized.

Although it has been described above that images are produced by a single measurement, these signals can separate positions only in the x direction. Therefore, the signals 414–417 are measured several times, while changing the magnitude of magnetic field of Gz 407, called "phase encode pulse," thereby to separate positions in the z direction for imaging. The number of changes is typically 256. Since the heart must be in the same state during the iterative measurements, it is monitored by the electrocardiograph so that the measurement is synchronized to heart beats. The sequence 103 shows this by example.

In order to observe the coronary artery dynamically, it is necessary to measure the blood flow at several time points within the period of heat beats. Therefore, the sequences 104, 105, ..., 106 are repeated at an interval of 50 ms, for example. These sequences are basically the same and merely differ from one another in the frequency of RF pulse 406 shown in FIG. 3 depending on the position thereby to compensate changes in the root of the aorta to be excited at each time point.

In MRI, the frequency of radio-frequency field has a one-to-one correspondence to the spin excitation position, and therefore by knowing the position of the root of the aorta, the frequency can be determined. Accordingly, a table is created in advance by measuring a change in the position of the root of the aorta at each time point. This table indicates the position of the aorta root at each time point from the occurrence of the R wave of the ECG (electrocardiograph). Thus, the electrocardiograph is used to determine these time points. Since, as mentioned above, the position and the frequency have a one-to-one correspondence, it becomes possible to make the aorta root position coincide with the excitation position by searching the aorta root position at each delay time from each R wave position and setting the frequency of the RF pulse to a frequency that corresponds to the searched position. The method of determining the position of the root of the aorta will be described later.

Figure 1:
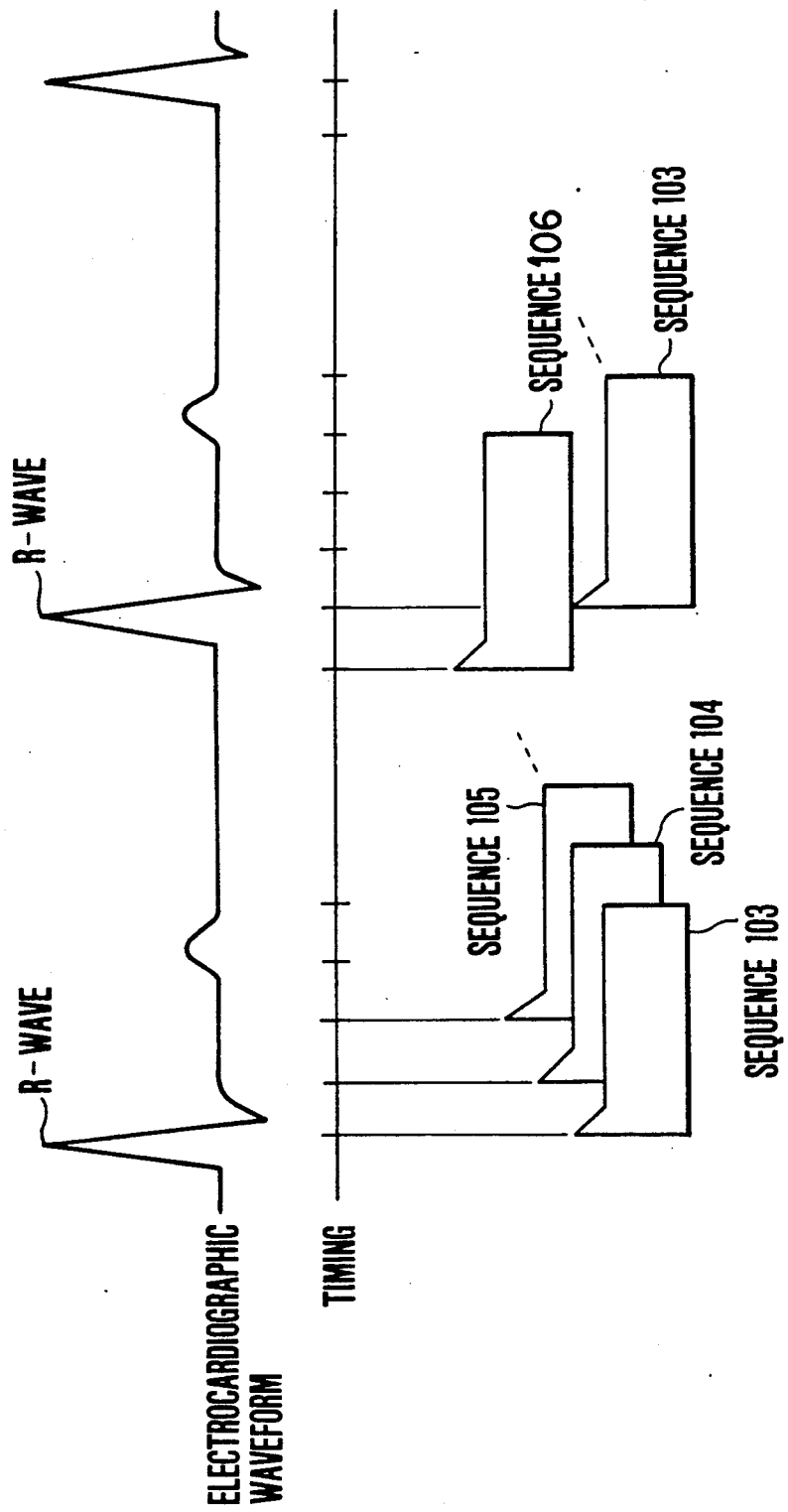
FIG. 1 is a diagram showing the concept of the overall imaging sequence according to this invention.
Figure 6:
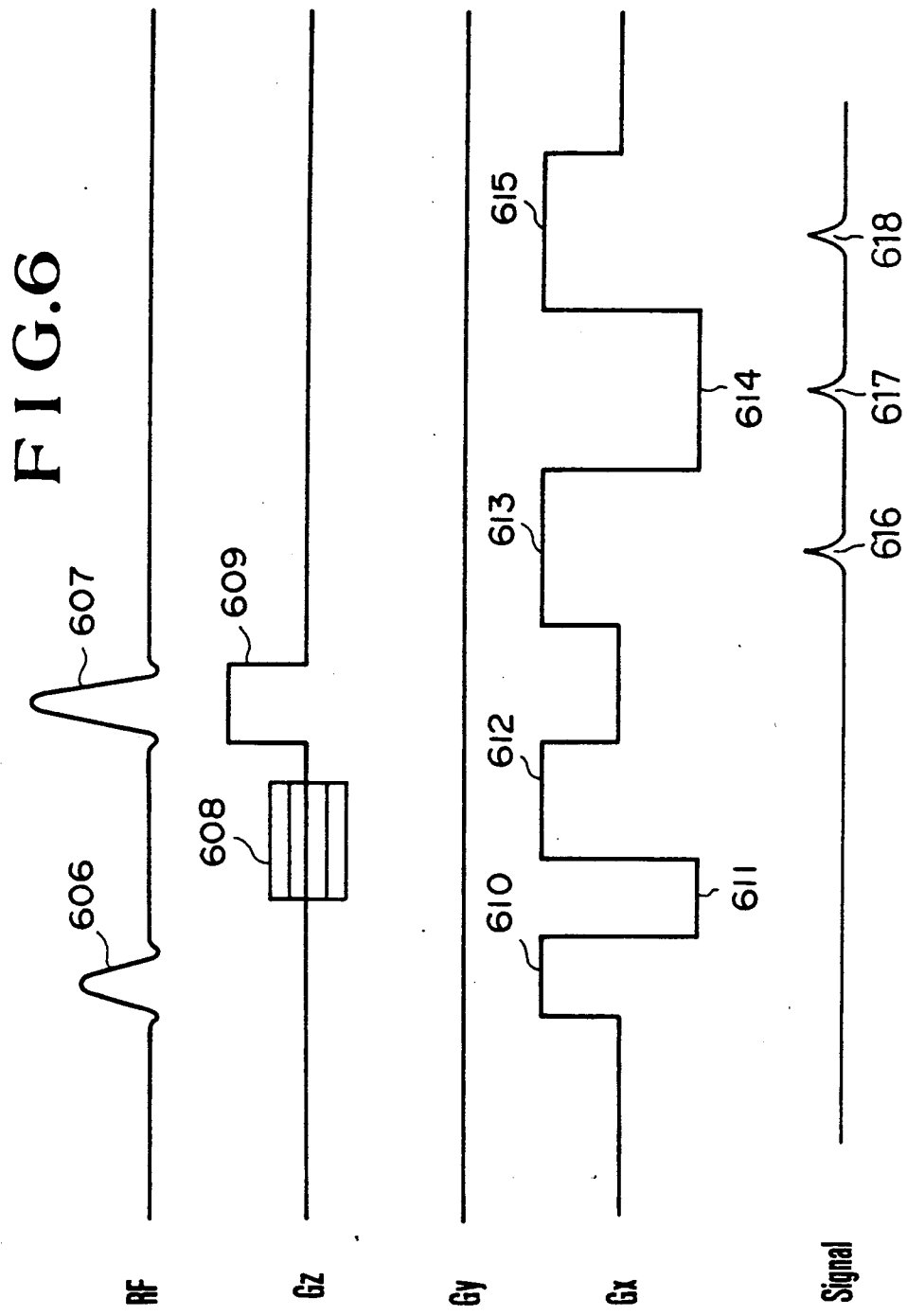
FIG. 6 is a diagram showing the pulse sequence based on another embodiment.
Figures 7, 9:
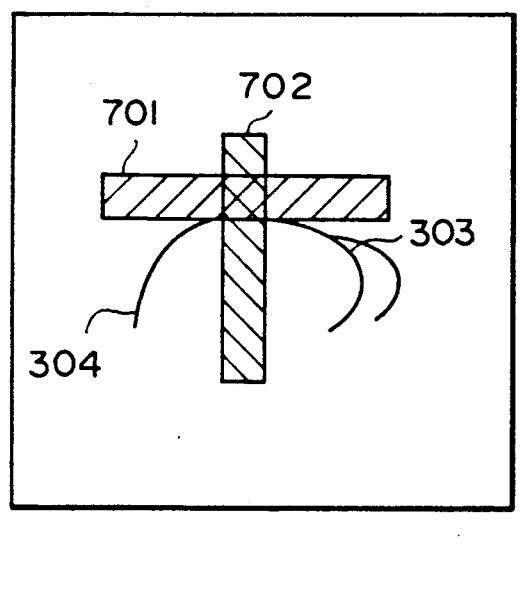
FIG. 7 is a diagram explaining the image produced by the sequence of FIG. 6.
FIG. 9 is a diagram showing, as an example, the position table for excitation.

FIG. 6 shows another embodiment of the sequences 103–105 in FIG. 1. In this case, excitation takes place as shown in FIG. 7, in which two radio-frequency fields are used for the selective excitation of the regions 701 and 702. These are RF pulses 606 and 607 in FIG. 6. The RF pulse 606 is also called "90° pulse" and, in this example, it is applied along with the gradient magnetic field Gx 610 for the selective excitation of the region 702. Subsequently, the RF pulse 607 and Gz 609 are applied simultaneously so as to excite the region 701 selectively by limiting the region in the z direction.

The phase encode pulse Gz 608 is a magnetic field which is applied, with its magnitude being varied for separating the z direction, as has been explained on FIG. 3. The x-direction gradient magnetic field 611 is to cancel the influence of the gradient magnetic field Gx 610. The Gx 612 is a dummy gradient magnetic field which is applied for the generation of the measurement signals at the center of the Gx 613, 614 and 615. In the same manner as FIG. 3, the Gx is reversed to take the measurement signals 616, 617 and 618. It is of course possible to take more signals. By summing at least one of these signals and lining up 256 pieces of measurement data obtained at every phase encode for the 2-Dimensional Fourier transformation, a blood vessel system can be imaged.

Next, the method of determining the position of the root of the aorta will be described. This example uses 3-dimensional imaging.

Figure 8:
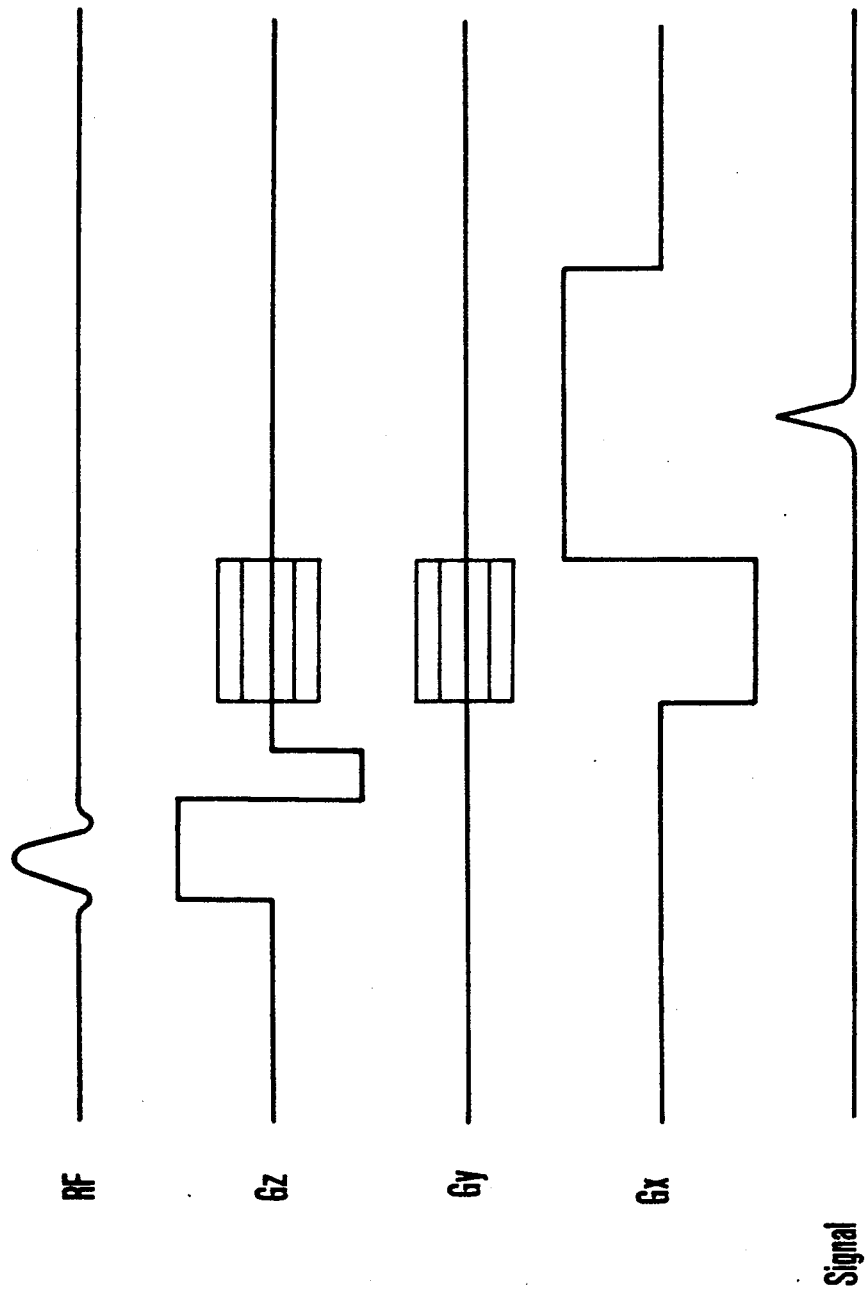
FIG. 8 is a diagram showing an example of sequence for determining the position of the root of aorta.

FIG. 8 shows an example of typical sequences for 3-dimensional imaging. In this sequence, signals are measured in synchronism with heart beats in the same manner as shown in FIG. 1. In this case, the slice selection positions are fixed to cover a sufficiently large region so that the whole heart is included at all time points. After imaging the object, the image is reconstructed and each slice is observed to determine the position of the root of the aorta at each time point. As shown in FIG. 9, a table is created to contain the X coordinates 902, Y coordinates 903 and Z coordinates 904 for each time point 901. This process may be instructed by the operator, or may be carried out automatically by application of a proper region extraction algorithm.

Besides the above example of 3-dimensional imaging, other possible determination schemes include those based on the root shape by 2-dimensional imaging with a large slice thickness and the use of ultrasonic wave diagnostic apparatus, provided that the approximate position of the root of the aorta is known.

Figure 10:
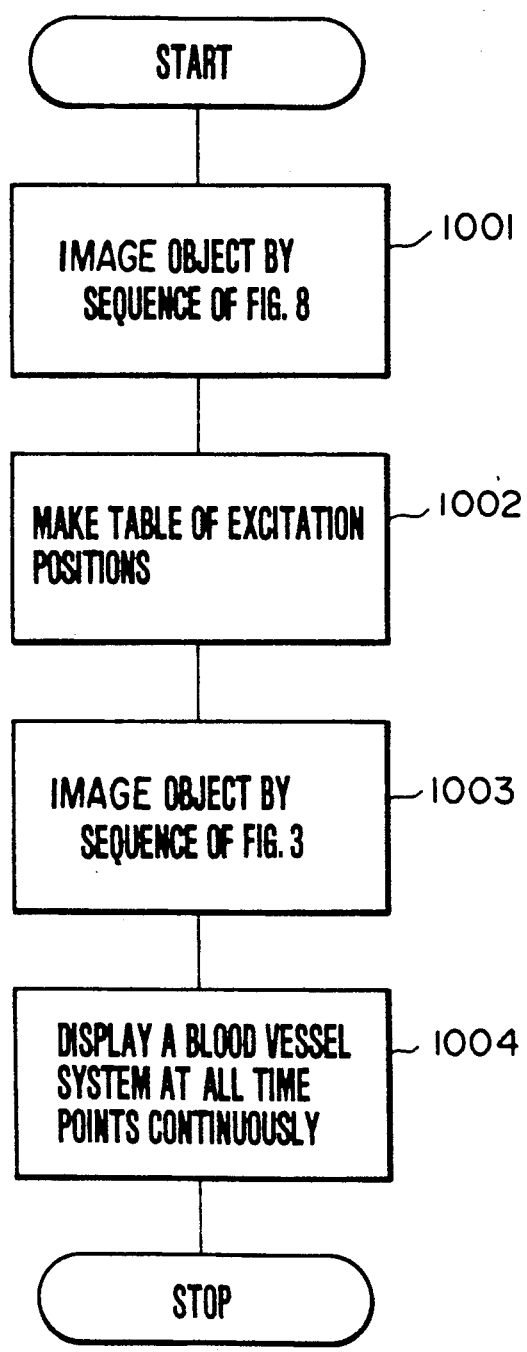
FIG. 10 is a flowchart showing, as an example, the procedure of overall process.

Finally, FIG. 10 is an example of a flowchart showing the overall processing procedure using 3-dimensional imaging for the positioning.

Step 1001: By 3-dimensional imaging shown in FIG. 8, the object is imaged at each heart beat.

Step 1002: The position of the root of the aorta is determined manually or using a computer, and the excitation position table shown in FIG. 9 is created.

Step 1003: Based on the excitation position table, a blood vessel image is imaged at each time point by using the sequence of FIG. 3.

Step 1004: Blood vessel images at every time point are displayed continuously in the same manner as cinematic images.

According to the foregoing embodiments, it becomes possible to capture the coronary artery at every time point within the period of heart beats, which has been difficult by the imaging of prior art MRI because of its movement with the heart, and to display the image in the same fashion as cinematic images. This eliminates the need of X-ray contrast photography which has been used for the diagnosis of heart, and offers high quality diagnostic information more safely.

Furthermore, if ultra high-speed imaging, which uses variable gradient magnetic fields, is applied to the 3-dimensional imaging for the positioning of excitation, the inspection time can be reduced favorably. In FIG. 5, by imaging the object so that the excitation position 501 is outside the view field and by cutting off the region with a filter, the static excitation position 501 is excluded from the measurement signals, whereby an even higher quality image can be obtained.

According to this invention, means of detecting the movement of an object under test is provided for the measurement of the position of the object and the position of excitation by the radio-frequency field is changed in accordance with the result of the measurement. Consequently, the invention realizes a method and apparatus for imaging a moving object, such as capturing on a time axis the dynamic changes of the coronary artery position due to heart beats.

We claim:

1. A method of imaging a moving portion in an object implemented by a magnetic resonance imaging apparatus which comprises a means for generating a static magnetic field, a gradient magnetic field and a radio frequency field to excite the object; a means for measuring nuclear magnetic resonance signals from the object under test, and means for performing various computations, including image reconstruction from said measured signals, wherein said method comprises the steps of: measuring a plurality of positions of the moving portion in said object; changing excitation positions to be excited by the radio frequency field in accordance with the result of said position measurement; measuring resonance signals from said excitation positions; reconstructing images from said measured resonance signals and displaying said images on a display, wherein said step of changing the excitation position includes at least one of varying the frequency of said radio frequency field and varying the amplitude characteristics of said gradient magnetic field.

2. A moving portion imaging method according to claim 1, wherein said excitation positions are in a region which continually encompasses a selected moving portion in said object.

3. A moving portion imaging method according to claim 1, wherein said step of measuring a plurality of positions of the moving portion in said object comprises a step of detecting a phase in each heart cycle by means of an electrocardiograph.

4. A moving portion imaging method according to claim 2, wherein said moving portion in said object is a connecting section between an aorta and a heart.

5. A moving portion imaging method according to claim 5, wherein said step of measuring a plurality of positions comprises a step of creating a table to define a relationship between electrocardiographic information provided by an electrocardiograph and positional information on the excitation position.

6. A moving portion imaging method according to claim 5, wherein said positional information on the connecting section of the aorta and heart is obtained by a 3-dimensional imaging method.

7. An apparatus for imaging a moving portion in an object comprising a magnetic resonance imaging apparatus which comprises a means for generating a static magnetic field, a gradient magnetic field and a radio frequency field to excite the object, a means for measuring nuclear magnetic resonance signals from the object under test, and a means for performing various computations, including image reconstruction from said measured signals, wherein said moving portion imaging apparatus further comprises a means for measuring a plurality of positions of the moving portion in said object; means for changing an excitation position to be excited by the radio frequency field in accordance with the result of said position measurement by said measuring means, wherein said means for changing the excitation position includes at least one of means for varying the frequency of said radio frequency field and means for varying the amplitude characteristics of said gradient magnetic field; and means for displaying the reconstructed images continuously.

* * * * *